United States Patent
Mailander et al.

(10) Patent No.: US 7,779,811 B1
(45) Date of Patent: Aug. 24, 2010

(54) THERMOELECTRICALLY COOLED COMPONENTS FOR DISTRIBUTED ELECTRONICS CONTROL SYSTEM FOR GAS TURBINE ENGINES

(75) Inventors: William James Mailander, Beverly, MA (US); Paul Bryant Goodwin, Hamilton, OH (US)

(73) Assignee: General Electric Company, Schenectady, NY (US)

( * ) Notice: Subject to any disclaimer, the term of this patent is extended or adjusted under 35 U.S.C. 154(b) by 1015 days.

(21) Appl. No.: 11/520,214

(22) Filed: Sep. 13, 2006

(51) Int. Cl.
*F02C 9/28* (2006.01)
*G05B 9/03* (2006.01)

(52) U.S. Cl. ......................... 123/399; 60/782
(58) Field of Classification Search ................ 60/782, 60/795, 806; 123/399
See application file for complete search history.

(56) References Cited

U.S. PATENT DOCUMENTS

| | | | |
|---|---|---|---|
| 4,773,212 A | 9/1988 | Griffin et al. | |
| 4,867,574 A | 9/1989 | Jenkofsky | |
| 6,102,001 A | 8/2000 | McLevige | |
| 6,481,211 B1 * | 11/2002 | Haas | 60/782 |
| 6,623,250 B2 | 9/2003 | Zagranski et al. | |
| 6,813,876 B2 | 11/2004 | Griffiths et al. | |
| 6,959,536 B1 | 11/2005 | Maher | |
| 6,962,485 B2 | 11/2005 | Bennett et al. | |
| 6,981,359 B2 | 1/2006 | Wernberg et al. | |
| 7,003,949 B2 | 2/2006 | Fenny et al. | |
| 7,007,452 B1 | 3/2006 | Baryshnikov et al. | |
| 7,036,302 B2 | 5/2006 | Myers, Jr. et al. | |
| 2003/0056492 A1 | 3/2003 | Henson | |
| 2004/0084781 A1 | 5/2004 | Ahn et al. | |
| 2005/0049775 A1 | 3/2005 | Mooney | |

FOREIGN PATENT DOCUMENTS

EP    1 905 986 A2 *   2/2008

OTHER PUBLICATIONS

INB Products, An Introduction of The Thermoelectric Module, INB Products, Inc., http://www.inbthermoelectric.com, Apr. 18, 2006, 1 page.
Technical Information, Thermoelectric cooling, Peltier coolers, cold plates, and heat sinks N TE Technology, http://www.tetech.com, Jul. 26, 2006, 25 pages.

* cited by examiner

*Primary Examiner*—Hieu T Vo
(74) *Attorney, Agent, or Firm*—William Scott Andes; Steven J. Rosen

(57) ABSTRACT

A gas turbine engine control component includes at least one electronic device, electronics such as an integrated circuit associated with the device, and a thermoelectric cooler for cooling the electronics mounted in a compartment. The thermoelectric cooler may be disposed in or on a wall of the compartment with a heat sink connected to a hot side of the thermoelectric cooler and a cold side of the thermoelectric cooler exposed to an interior of the compartment. Data about and/or operating instructions for the device may be stored in memory on the integrated circuit. The data may be calibration information for the device. A bus connector is connected to the integrated circuit for transferring operating instructions and/or data from the integrated circuit out and/or out of the component. A controller or control system incorporating these devices and components have the devices electronically connected to the integrated circuit.

44 Claims, 4 Drawing Sheets

THERMOELECTRICALLY COOLED COMPONENTS FOR DISTRIBUTED ELECTRONICS CONTROL SYSTEM FOR GAS TURBINE ENGINES

BACKGROUND OF THE INVENTION

Field of the Invention

This invention relates to gas turbine engine control systems and associated control components and, more particularly, to cooling such components in the systems.

Gas turbine engines typically incorporate hierarchical electronic control systems in which various control hardware and devices are controlled and/or monitored by a central electronic digital control sometimes referred to a full authority digital engine control (FADEC). Hierarchical control systems have limited redundancy, lack of flexibility, are subject to expensive obsolescence concerns, have extensive cabling requirements and have limited diagnostic capability. Distributed electronics control systems having autonomous or semi-autonomous control components are being developed in order to provide greater reliability and flexibility and to address expensive obsolescence concerns.

Distributed electronic control systems are disclosed in U.S. patent application Ser. No. 10/652,382, filed Aug. 29, 2003, and published as Patent Publication No. 20050049775 A1 on Mar. 3, 2005. The patent application is entitled "Distributed Engine Control System and Method" and is assigned to the General Electric Company, the same assignee as that of this patent. Distributed electronics and associated control components require less extensive cabling and have improved diagnostic capabilities. Patent Publication No. 20050049775 A1 discloses a system and method for real time distributed electronics engine control. The system replaces centralized hierarchical control architecture with an autonomous distributed network. The system replaces analog input/output signals with digitized data packets and replaces point-to-point wiring and data bus control with flexible virtual connections using digital switching technology.

Control components in the system obtain measured data from their sensor elements. Sensors or control components contain electronics to convert their data into digital data words. The control components of a gas turbine engine distributed electronics engine control operate in a hot environment that is not conducive to proper operation of the digital electronics. Cooling air or fuel is expensive and/or requires extensive plumbing. It adds to construction and maintenance costs and tends to reduce reliability of the system. Its effectiveness is dependent on the engine's operation during various operating conditions where the supply of cooling fluid and temperature sinks available varies over the operating cycle of the engine. Thus, it is desirable to have an effective cooling system for the electronics in such components and the system that provided reliable inexpensive cooling that is also inexpensive to operate and which overcomes the above stated difficulties.

SUMMARY OF THE INVENTION

A gas turbine engine control component includes at least one electronic device, at least one integrated circuit associated with the device and located inside a compartment of the component, and a thermoelectric cooler operably disposed for cooling the integrated circuit in the compartment. The thermoelectric cooler may be disposed in or on a wall of the compartment, a heat sink may be operably connected to a hot side of the thermoelectric cooler, and a cold side of the thermoelectric cooler may be exposed to an interior of the compartment. The compartment may have insulation and a power supply mounted inside the compartment for powering the thermoelectric cooler and/or the integrated circuit.

Data about and/or operating instructions for the device may be stored electronically in memory on the integrated circuit and the data may include calibration information for the device. The device may be a sensor such as for measuring any of the following; temperature, pressure, main combustor fuel flow, afterburner combustor fuel flow, fan inlet guide vane actuator stroke position, compressor variable vane actuator stroke position, or shaft rotational speed in the engine.

The gas turbine engine control component or the device may be used in a gas turbine engine main or afterburner fuel controller. The devices and or controllers may be used in a gas turbine engine control system having a plurality of the gas turbine engine control devices in which each of the devices is connected to a digital network.

BRIEF DESCRIPTION OF THE DRAWINGS

The foregoing aspects and other features of the invention are explained in the following description, taken in connection with the accompanying drawings where.

DETAILED DESCRIPTION OF THE INVENTION

Modern gas turbine engine control systems are used to control various functions of the engine. Exemplary gas turbine engine control systems include main and afterburner fuel control systems which are also used to power fan and compressor variable vane geometry control systems. Control systems include sensors, signal processing electronics, control functions, actuator drivers, valves, electro hydraulic servo-valves, and solenoids to assure safe, reliable engine operation throughout the aircraft flight envelope.

Figure 1:
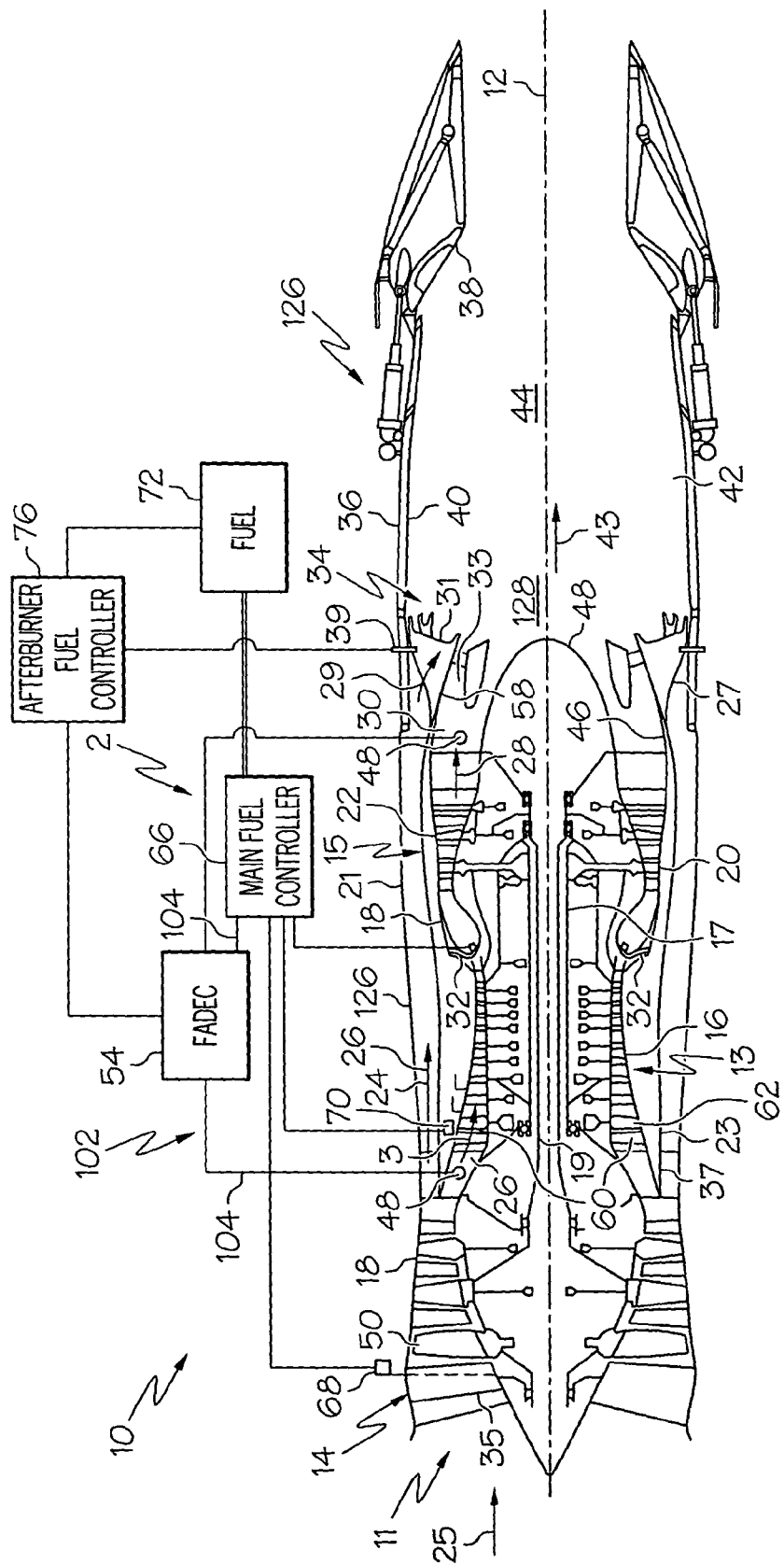
FIG. 1 is an axial sectional and schematical view illustration through an exemplary turbofan gas turbine engine having an exemplary distributed electronics engine control system with engine control components having thermoelectrically cooled electronics.

Illustrated in FIG. 1 is an exemplary medium bypass ratio turbofan gas turbine engine 10 for powering an aircraft (not shown) in flight having a distributed electronics fuel control system 2 with components 4, such as a main fuel controller 66, having thermoelectrically cooled electronics. The fuel control system 2 exemplifies a distributed electronics engine control system or digital network with engine control components having thermoelectrically cooled electronics. Operation of distributed electronics fuel control system 2 is monitored and controlled by an electronic engine control 54, such as a full authority digital engine control (FADEC) which receives input signals from the engine that are representative of various engine operating parameters and include pressures and temperatures from various sensors around the engine and also input signals from the airframe, such as engine power demand. Typical input signals to electronic engine control 54 include airframe power lever position, engine and fan rotational speeds, compressor discharge pressure, turbine exhaust temperature, variable compressor stator vane position, variable fan guide vane position, and exhaust nozzle area, as well as the positions of any other variable position elements of the engine including fuel valves. Additional engine operating parameters can also be provided as will be appreciated by those skilled in the art. The electronic engine control 54 also sends electronic instructions to many servo-valves and solenoids which operate elements of the engine such as fuel pumps, variable vane actuators and transfer and on and off valves to name a few.

The engine 10 is axisymmetrical about a longitudinal or axial centerline axis 12 and has a fan section 14 upstream of a core engine 13. A circumferential row of fan inlet guide vanes 35 is disposed between a fan inlet 11 and a rotatable fan 50 in the fan section 14. The core engine 13 includes, in serial downstream flow communication, a multistage axial high pressure compressor 16, an annular main combustor 18, and a turbine section 15. The high pressure compressor 16 has interdigitated rows of variable stator vanes and rotatable compressor blades 60 and 62. The turbine section 15 illustrated herein includes a high pressure turbine 20 suitably joined to the high pressure compressor 16 by a high pressure drive shaft 17. Downstream of the turbine section 15 and the core engine 13 is a multistage low pressure turbine 22 suitably joined to the fan section 14 by a low pressure drive shaft 19. The core engine 13 is contained within a core engine casing 23 and an annular bypass duct 24 is circumscribed about the core engine 13. An engine casing 21 circumscribes the bypass duct 24 which extends from the fan section 14 downstream past the low pressure turbine 22.

Engine air 25 enters the engine through the fan inlet 11 and is initially pressurized as it flows downstream through the fan section 14. A splitter 37 splits the engine air 25 into an inner portion thereof referred to as core engine air 3 which flows through the high pressure compressor 16 for further compression and an outer portion thereof referred to as bypass air 26 which bypasses the core engine 13 and flows through the bypass duct 24. The core engine air 3 is suitably mixed with fuel 42 by main fuel injectors 32 and carburetors in the main combustor 18 and ignited for generating hot combustion gases which flow through the turbines 20, 22 and are discharged therefrom as core gases 28 into a diffuser duct 33 aft and downstream of the turbines 20, 22 in the engine 10.

The core engine 13 also includes an annular core outlet 30 and the bypass duct 24 includes an annular bypass duct outlet 27 for respectively discharging the core gases 28 and an injected portion 29 of the bypass air 26 downstream into the exhaust section 126 of the engine 10. A mixer 31 is disposed in the annular bypass duct outlet 27 and includes a plurality of mixer chutes 58 extending radially inwardly into the exhaust flowpath 128 from the bypass duct 24. The mixer 31 mixes the core gases 28 and an injected portion 29 of the bypass air 26 resulting in an exhaust gas flow 43 and flows it into the exhaust section 126 and the combustion zone 44 within the exhaust section 126. An afterburner 34 includes a circumferential array of radially inwardly extending thrust augmentation fuel injectors 39 are disposed within and between the chutes 58 of the mixer 31. The thrust augmentation fuel injectors 39 provide fuel for combustion in the combustion zone 44 for thrust augmentation.

The exhaust section 126 includes an annular exhaust casing 36 disposed coaxially with and suitably attached to the corresponding engine casing 21 and surrounding an exhaust flowpath 128. Mounted to the aft end of the exhaust casing 36 is a conventional variable area converging-diverging exhaust nozzle 38 through which the bypass air 26 and core gases 28 are discharged during operation. An exhaust section combustion zone 44 within the exhaust flowpath 128 is located radially inwardly from an exhaust liner 40 and the bypass duct 24 and downstream or aft of the core engine 13 and the low pressure turbine 22. Thus, the combustion zone 44 located radially inwardly from the bypass duct 24 and outlet 27. The core gases 28 are flowed from the core outlet 30 into the combustion zone 44.

Figure 2:
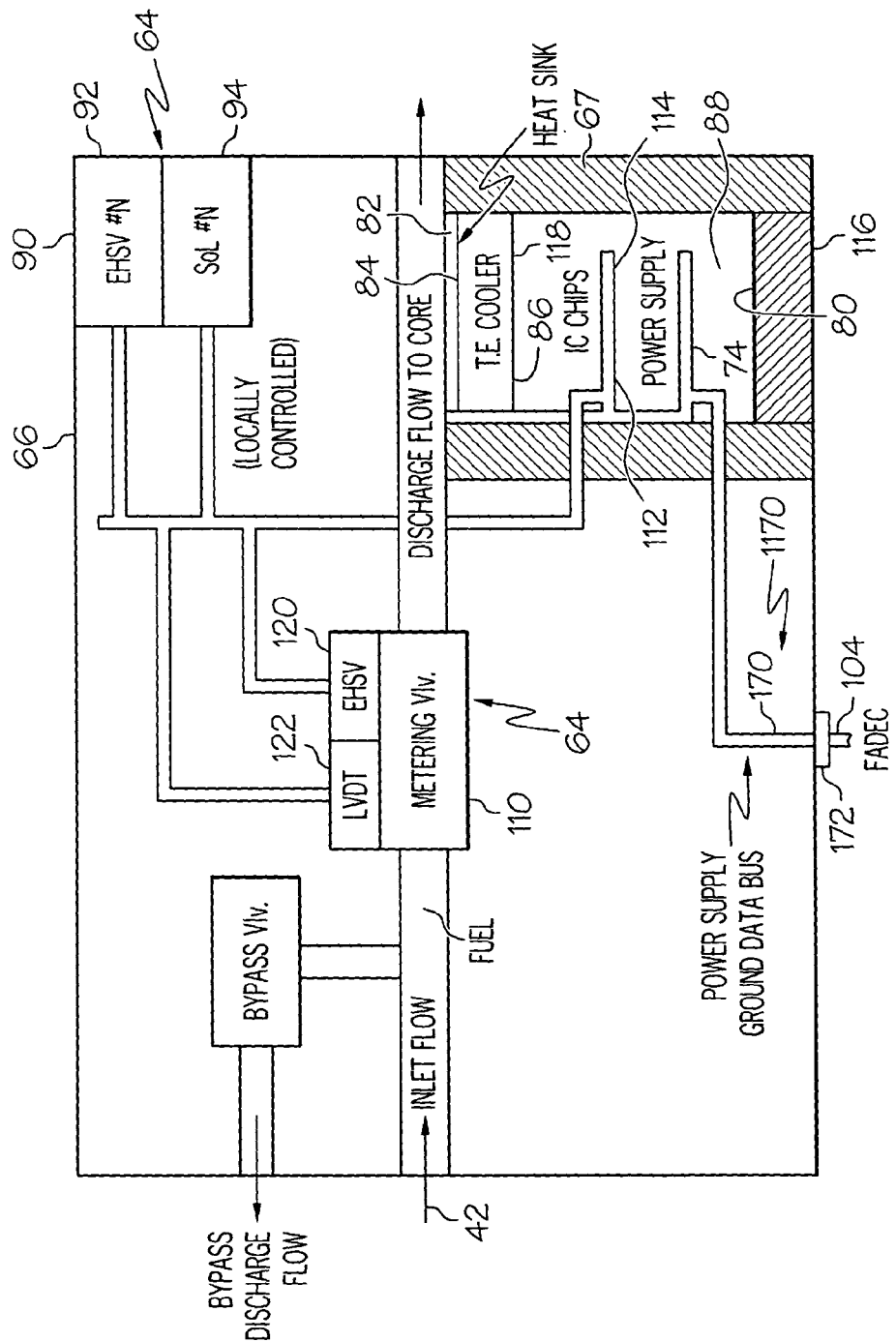
FIG. 2 is a schematic view illustration of an exemplary fuel controller with thermoelectrically cooled electronics for a distributed electronics engine control system for the aircraft gas turbine engine illustrated in FIG. 1.

The fuel control system 2 exemplifies a distributed electronics engine control system with thermoelectrically cooled engine control components. The distributed electronics fuel control system 2 is illustrated herein as being used to supply fuel to the main fuel injectors 32 and the thrust augmentation fuel injectors 39. The distributed electronics fuel control system 2 illustrated in FIG. 2 is a main fuel controller 66 having several thermoelectrically cooled powered components 64. A similar afterburner fuel controller 76 is used for the afterburner 34 to supply fuel to the thrust augmentation fuel injectors 39. Pressurized fuel is supplied from a pressurized fuel source 72 to the main fuel controller 66 and the afterburner fuel controller 76. The pressurized fuel is used for powering fan inlet guide vane and variable vane compressor actuators 68 and 70 that operate the variable fan inlet guide vanes 35 and variable stator vanes 60 in the high pressure compressor 16, respectively.

The main fuel controller 66 illustrated in FIG. 2 is an exemplary gas turbine engine control component with thermoelectrically cooled electronics. The main fuel controller 66 includes a few electronic devices such as main fuel metering valve 110 electronically connected to an integrated circuit (IC) 112 having a micro-processor 114. The integrated circuit is located inside an insulated compartment 116 of the main fuel controller 66 and exemplifies the thermoelectrically cooled electronics. The exemplary compartment 116 illustrated herein has insulation 67 located in walls 80 of the compartment 116. A thermoelectric cooler 118 is operably located in the compartment 116 for cooling the integrated circuit 112.

The thermoelectric cooler 118 and/or the integrated circuit 112 are powered by a power supply 74 which in turn receives electrical power via an integrated power supply and bus cable 170. Electricity to power the thermoelectric cooler 118 and/or the integrated circuit 112 can also be brought in from an external source such as the FADEC via the integrated power supply and bus cable 170. The thermoelectric cooler 118 may be disposed in or on one of the walls 80 of the compartment 116. A heat sink 82 is operably connected to a hot side 84 of the thermoelectric cooler 118. The heat sink source illustrated herein is relatively cold fuel 42 and cold air may also be used as a heat sink source. A cold side 86 of the thermoelectric cooler 118 is exposed to an interior 88 of the compartment to cool the integrated circuit 112 and the micro-processor 114 of the integrated circuit if it has one. The cable 170 is connected to the integrated circuit 112 and has a bus connector 172 for connecting the cable to the bus 104.

The thermoelectric cooler 118 is very effective in cooling the integrated circuit 112 so that it can operate over a wide range of high engine temperatures, which may be caused by hot fuel, during the engine's operation during various operating conditions. This helps to insure the quality of its operation and where the supply of cooling fluid and temperature sinks available varies over the operating cycle of the engine.

The thermoelectric cooler 118 provides an effective cooling system for the electronics in the components and reliable inexpensive cooling.

The main fuel metering valve 110 has an electro-hydraulic servo-valve (EHSV) 120 for setting the position of the main fuel metering valve 110 and a position sensor indicated as a linear variable displacement transducer (LVDT) 122 for providing electronic position feedback of the main fuel metering valve 110 to the integrated circuit 112. The integrated circuit 112 can serve various purposes and functions. The integrated circuit 112 can store calibration data about the EHSV, the main fuel metering valve 110, and or the LVDT. The integrated circuit 112 can also provide instructions for the operation of the EHSV and/or the main fuel metering valve 110. The integrated circuit 112 can take input from the EHSV, the main fuel metering valve 110, and or the LVDT and convert the data into digital information and send it to the electronic engine control 54 or FADEC along the controller area network via the bus 104. Other devices typically found in controllers include shutoff on/off valves 90 and transfer valves 92 and various other electro-hydraulic servo-valves (EHSV) 120. The shutoff on/off valves 90 and the transfer valves 92 include electrically powered solenoids 94, are electronically connected to the integrated circuit 112, and send and receive data and/or instructions to and from the FADEC over the bus to open and close.

Figure 3:
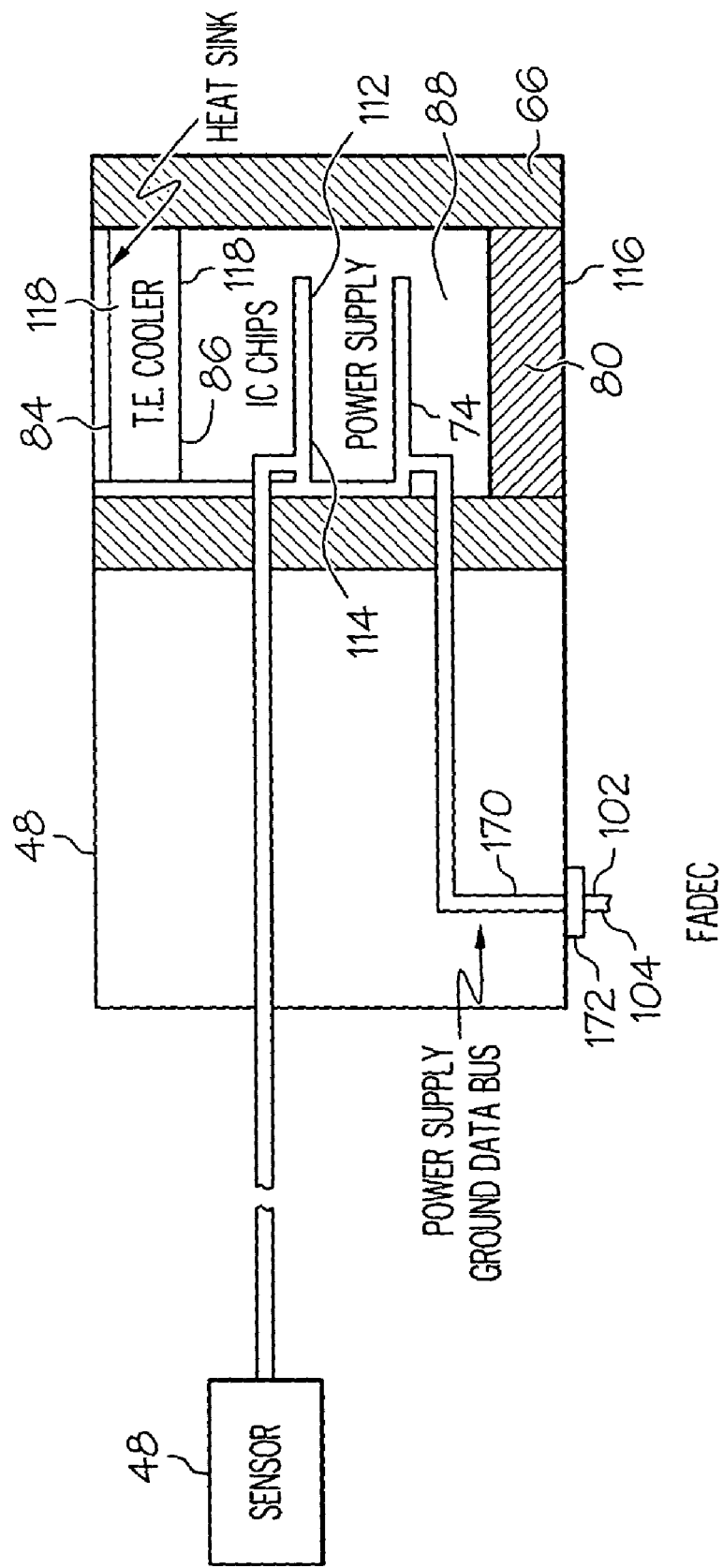
FIG. 3 is a schematic view illustration of another exemplary engine control component in the form of a sensor having thermoelectrically cooled electronics for the aircraft gas turbine engine illustrated in FIG. 1.

Real time analog sensor data is acquired using sensors using a sensing transducer, such as by measuring temperature with a resistive temperature measuring device 48 as is illustrated in FIG. 3. The same is done for any physical transducer such as pressure transducers 46, an exemplary location of which is illustrated in FIG. 1. Electronics in the sensor component autonomously convert the analog signals or data into digital signals or data in an integrated circuit 112. Once the analog data is converted to digital data, the digital data is routed across a network 102, such as a controller area network (CAN) via a bus 104 to, for example, the FADEC or perhaps to another component such as the fuel control system 2. Since the digital data is decoupled from its source transducer, all the data can be handled on the same network, control components can be added or removed or upgraded, as desired by the system design team, and the path from the source to the destination is not dependent on any single connection. Thus, the components and the system are more reliable and accurate.

Figure 4:
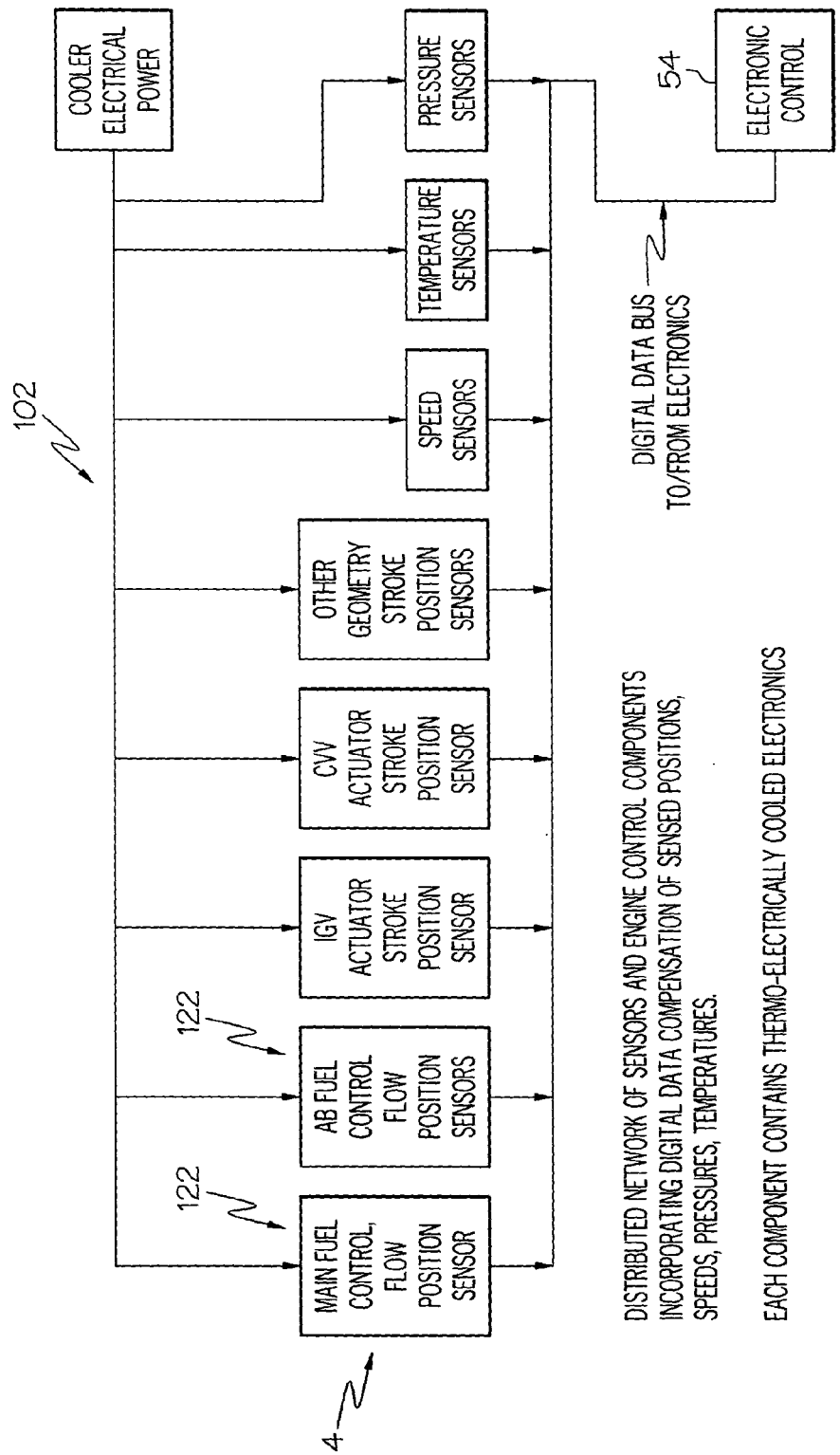
FIG. 4 is a schematic view illustration of a distributed electronics engine control system with cooled engine control components having thermoelectrically cooled electronics.

Schematically illustrated in FIG. 4 is the distributed electronics network 102 having various engine control components 4 having thermoelectrically cooled electronics. Current engine control systems incorporate analog input and output signals wired directly to the electronic engine control 54 or FADEC. The fuel control system 2 with distributed electronics having engine control components includes sensors with thermoelectrically cooled electronics such as shaft speed sensors and pressure and temperature sensors. Other components in the network 102 with thermoelectrically cooled electronics include a main fuel controller 66 and an afterburner fuel controller 76 (illustrated in FIG. 1) having main and AB (afterburner) fuel control flow position sensors, respectively, which are illustrated herein as linear variable displacement transducers (LVDTs) 122. The fan inlet guide vane and variable vane compressor actuators 68 and 70 (illustrated in FIG. 1) have IGV and CVV actuator stroke position sensors which are illustrated herein as linear variable displacement transducers (LVDTs) 122. The sensors schematically illustrated in FIG. 4 are connected to the distributed electronics network 102 by way of thermoelectrically cooled electronics such as integrated circuits disclosed above. Calibration data stored in the electronics or integrated circuits of the sensors allow accurate compensation of the sensors based on temperature or other calibration parameters. Other components with thermoelectrically cooled electronics contemplated but not illustrated herein include air valves such as ones used active clearance control, bore core cooling, high pressure bleed valves, and flow control valves.

While there have been described herein what are considered to be preferred and exemplary embodiments of the present invention, other modifications of the invention shall be apparent to those skilled in the art from the teachings herein and, it is therefore, desired to be secured in the appended claims all such modifications as fall within the true spirit and scope of the invention. Accordingly, what is desired to be secured by Letters Patent of the United States is the invention as defined and differentiated in the following claims.

What is claimed is:

1. A gas turbine engine control component comprising:
    at least one electronic device,
    an integrated circuit associated with the device and located inside a compartment of the component, and
    a thermoelectric cooler operably disposed for cooling the integrated circuit in the compartment.

2. A component as claimed in claim 1 further comprising:
    the thermoelectric cooler disposed in or on a wall of the compartment,
    a heat sink operably connected to a hot side of the thermoelectric cooler, and
    a cold side of the thermoelectric cooler exposed to an interior of the compartment.

3. A component as claimed in claim 2 further comprising the compartment having insulation.

4. A component as claimed in claim 1 further comprising a power supply mounted inside the compartment for powering the thermoelectric cooler and/or the integrated circuit.

5. A component as claimed in claim 1 further comprising data about and/or operating instructions for the device stored electronically in memory on the integrated circuit.

6. A component as claimed in claim 5 further comprising the data including calibration information for the device.

7. A component as claimed in claim 1 further comprising the device being a sensor.

8. A component as claimed in claim 7 further comprising the device being a sensor for measuring temperature or pressure or main combustor fuel flow or afterburner combustor fuel flow or fan inlet guide vane actuator stroke position or compressor variable vane actuator stroke position or engine shaft rotational speed.

9. A component as claimed in claim 8 further comprising:
    the thermoelectric cooler disposed in or on a wall of the compartment,
    a heat sink operably connected to a hot side of the thermoelectric cooler, and
    a cold side of the thermoelectric cooler exposed to an interior of the compartment.

10. A component as claimed in claim 9 further comprising the compartment having insulation.

11. A component as claimed in claim 10 further comprising a power supply located inside the compartment and operable for powering the thermoelectric cooler and/or the integrated circuit.

12. A component as claimed in claim 11 further comprising data about and/or operating instructions for the device stored electronically in memory on the integrated circuit.

13. A component as claimed in claim 12 further comprising the data including calibration information for the device.

14. A component as claimed in claim 13 further comprising a bus to transfer the data out of and/or into the component.

15. A component as claimed in claim 1 further comprising the device being an on/off valve or a metering valve with a position sensor for providing electronic position feedback of the metering valve to the integrated circuit.

16. A component as claimed in claim 15 further comprising the position sensor being a linear variable displacement transducer.

17. A component as claimed in claim 16 further comprising:
   the thermoelectric cooler disposed in or on a wall of the compartment,
   a heat sink operably connected to a hot side of the thermoelectric cooler, and
   a cold side of the thermoelectric cooler exposed to an interior of the compartment.

18. A component as claimed in claim 17 further comprising the compartment having insulation.

19. A component as claimed in claim 18 further comprising a power supply located inside the compartment and operable for powering the thermoelectric cooler and/or the integrated circuit.

20. A component as claimed in claim 15 further comprising data about and/or operating instructions for the device stored electronically in memory on the integrated circuit.

21. A component as claimed in claim 20 further comprising the data including calibration information for the device.

22. A component as claimed in claim 21 further comprising a bus to transfer the data out of and/or into the component.

23. A gas turbine engine controller comprising:
   one or more electrically powered and controllable devices,
   an integrated circuit having a micro-processor and electronically connected to the one or more devices, and
   a thermoelectric cooler operably disposed for cooling the integrated circuit in the compartment.

24. A controller as claimed in claim 23 further comprising:
   the devices including one or more on/off valves and one or more metering valves,
   each of the metering valves having a position sensor for providing electronic position feedback of the one or more metering valves to the integrated circuit.

25. A controller as claimed in claim 24 further comprising the position sensor being a linear variable displacement transducer.

26. A controller as claimed in claim 24 further comprising:
   the thermoelectric cooler disposed in or on a wall of the compartment,
   a heat sink operably connected to a hot side of the thermoelectric cooler, and
   a cold side of the thermoelectric cooler exposed to an interior of the compartment.

27. A controller as claimed in claim 23 further comprising the compartment having insulation.

28. A controller as claimed in claim 27 further comprising a power supply located inside the compartment and operable for powering the thermoelectric cooler and/or the integrated circuit.

29. A controller as claimed in claim 28 further comprising data about and/or operating instructions for one or more of the valves stored electronically in memory on the integrated circuit.

30. A controller as claimed in claim 29 further comprising the data including calibration information.

31. A controller as claimed in claim 30 further comprising a bus to transfer the data out of and/or into the controller.

32. A system as claimed in claim 28 further comprising:
   a second plurality of compartments having integrated circuits and thermoelectric coolers operably disposed for cooling the integrated circuits inside the compartments,
   the plurality including the integrated circuit in the compartment and the thermoelectric cooler, and
   data about and/or operating instructions for one or more of the deices stored electronically in memory on the integrated circuits.

33. A system as claimed in claim 32 further comprising the data including calibration information.

34. A system as claimed in claim 33 wherein the devices further include fuel pressure and temperature sensors and electro-hydraulic servo-valve (EHSV) and the metering valves include main burner and afterburner fuel metering valves.

35. A system as claimed in claim 34 wherein the devices further include fan inlet guide vane actuator stroke position sensors, compressor variable vane actuator stroke position sensors, and engine shaft rotational speed sensors.

36. A gas turbine engine control system comprising:
   a first plurality of gas turbine engine control devices,
   each of the devices associated with an integrated circuit electronically connected to a digital network and located in a compartment, and
   a thermoelectric cooler operably disposed for cooling the integrated circuit inside the compartment.

37. A system as claimed in claim 36 wherein the devices include one or more on/off valves and one or more metering valves and each of the metering valves has a position sensor for providing electronic position feedback of the metering valve to the integrated circuit.

38. A system as claimed in claim 37 herein the position sensor is a linear variable displacement transducer.

39. A system as claimed in claim 37 wherein the devices further include fuel pressure and temperature sensors and electro-hydraulic servo-valve EHSV) and the metering valves include main burner and afterburner fuel metering valves.

40. A system as claimed in claim 39 wherein the position sensor is a linear variable displacement transducer.

41. A system as claimed in claim 36 further comprising:
   the thermoelectric cooler disposed in or on a wall of the compartment,
   a heat sink operably connected to a hot side of the thermoelectric cooler, and
   a cold side of the thermoelectric cooler exposed to an interior of the compartment.

42. A system as claimed in claim 41 further comprising the compartment having insulation.

43. A system as claimed in claim 42 further comprising an electrical power supply located inside the compartment and operable for powering the thermoelectric cooler and/or the integrated circuit.

44. A system as claimed in claim 43 further comprising a heat sink source in heat exchange relationship with the heat sink wherein the heat sink source is cold fuel or cold air.

* * * * *